United States Patent
Ishida et al.

(10) Patent No.: US 9,525,062 B2
(45) Date of Patent: Dec. 20, 2016

(54) INSULATED GATE SWITCHING ELEMENT

(71) Applicant: Toyota Jidosha Kabushiki Kaisha, Toyota-shi, Aichi-ken (JP)

(72) Inventors: Takashi Ishida, Toyota (JP); Takashi Okawa, Nisshin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/133,993

(22) Filed: Apr. 20, 2016

(65) Prior Publication Data
US 2016/0315190 A1 Oct. 27, 2016

(30) Foreign Application Priority Data
Apr. 22, 2015 (JP) ................. 2015-087744

(51) Int. Cl.
| | |
|---|---|
| H01L 21/00 | (2006.01) |
| H01L 29/78 | (2006.01) |
| H01L 29/06 | (2006.01) |
| H01L 29/10 | (2006.01) |

(52) U.S. Cl.
CPC ....... H01L 29/7824 (2013.01); H01L 29/0634 (2013.01); H01L 29/1083 (2013.01); H01L 29/1095 (2013.01); H01L 29/7823 (2013.01)

(58) Field of Classification Search
CPC ............. H01L 29/7824; H01L 29/1083; H01L 29/0634
See application file for complete search history.

(56) References Cited

U.S. PATENT DOCUMENTS

| | | | | |
|---|---|---|---|---|
| 9,035,386 | B2 * | 5/2015 | Chan ................ | H01L 21/02697 257/365 |
| 9,224,872 | B2 * | 12/2015 | Kawakami .......... | H01L 29/7885 |
| 2004/0262680 | A1 * | 12/2004 | Ehwald ............... | H01L 29/0615 257/335 |
| 2006/0273387 | A1 * | 12/2006 | Hisanaga ............ | H01L 29/7395 257/330 |
| 2008/0087951 | A1 * | 4/2008 | Takaya ................ | H01L 29/0623 257/334 |
| 2010/0065885 | A1 * | 3/2010 | Ludikhuize ............. | H01L 21/84 257/133 |
| 2012/0261750 | A1 | 10/2012 | Yamashina et al. | |

(Continued)

FOREIGN PATENT DOCUMENTS

JP 2011-187853 A 9/2011

*Primary Examiner* — Laura Menz
(74) *Attorney, Agent, or Firm* — Dinsmore & Shohl LLP

(57) ABSTRACT

An insulated gate switching element includes: a semiconductor substrate; a gate insulating film disposed on a surface of the semiconductor substrate; and a gate electrode disposed on the gate insulating film. The semiconductor substrate includes a first semiconductor region, a base region, and a second semiconductor region. The gate electrode faces the base region with the gate insulating film interposed therebetween. A high-resistance region, which is separated from the gate insulating film and has higher resistance to a number of carriers of a first conduction type semiconductor than that of the base region, is disposed in at least one of a first interface which is an interface between the base region and the first semiconductor region and a second interface which is an interface between the base region and the second semiconductor region.

10 Claims, 14 Drawing Sheets

(56) References Cited

U.S. PATENT DOCUMENTS

| | | | |
|---|---|---|---|
| 2014/0319577 A1* | 10/2014 | Sugimoto | H01L 29/7397 257/139 |
| 2016/0013286 A1* | 1/2016 | Tomita | H01L 29/872 257/472 |
| 2016/0035719 A1* | 2/2016 | Kanechika | H01L 29/66462 257/195 |

* cited by examiner

INSULATED GATE SWITCHING ELEMENT

CROSS-REFERENCE TO RELATED APPLICATIONS

The present disclosure claims priority to Japanese Patent Application No. 2015-087744 filed on Apr. 22, 2015, which is incorporated herein by reference in its entirety including the specification, drawings and abstract.

BACKGROUND

1. Technical Field

The present disclosure relates to an insulated gate switching element.

2. Description of Related Art

Japanese Patent Application Publication No. 2011-187853 (JP 2011-187853 A) discloses a metal-oxide-semiconductor field-effect transistor (MOSFET). When a voltage of a threshold or higher is applied to a gate electrode of the MOSFET, a channel is formed in a base region. Therefore, carriers flow from a source region toward a drain region through the channel. That is, the MOSFET is turned on. When the voltage applied to the gate electrode is reduced to be lower than the threshold, the channel disappears and the flow of the carriers is stopped. That is, the MOSFET is turned off.

SUMMARY

When the MOSFET is off, a large potential difference is applied between the source region and the drain region. Therefore, when the MOSFET is off, there may be cases where leakage current flows between the source region and the drain region through the base region. Particularly, in MOSFETs in recent years, for the purpose of reducing an on-resistance or the like, the distance between the source region and the drain region has been reduced. Accordingly, leakage current is more likely to flow. Similarly, even in an insulated-gate bipolar transistor (IGBT), the distance between an emitter region and the source region is reduced, and leakage current is likely to flow. Here, the present disclosure provides a technique for suppressing leakage current of an insulated gate switching element such as a MOSFET or an IGBT.

An insulated gate switching element according to an aspect of the present disclosure includes: a semiconductor substrate; a gate insulating film disposed on a surface of the semiconductor substrate; and a gate electrode disposed on the gate insulating film. The semiconductor substrate includes a first semiconductor region, a base region, and a second semiconductor region. The first semiconductor region is a first conduction type region exposed at the surface. The base region is a second conduction type region which is exposed at the surface and comes into contact with the first semiconductor region. The second semiconductor region is a first conduction type region which is exposed at the surface, comes into contact with the base region, and is separated from the first semiconductor region. The gate electrode faces the base region in an area, in which the first semiconductor region and the second semiconductor region are separated from each other, with the gate insulating film interposed therebetween. A high-resistance region, which is separated from the gate insulating film and has higher resistance to a number of carriers of a first conduction type semiconductor than that of the base region, is disposed in at least one of a first interface which is an interface between the base region and the first semiconductor region and a second interface which is an interface between the base region and the second semiconductor region.

One of the first conduction type and the second conduction type is an n-type, and the other is a p-type. In a case where the insulated gate switching element is an n-channel MOSFET, the first conduction type is the n-type. In a case where the insulated gate switching element is a p-channel MOSFET, the first conduction type is the p-type. In a case where the insulated gate switching element is an IGBT, the first conduction type is the n-type. The first semiconductor region may come into contact with a main base region in a state of being surrounded by the main base region. Similarly, the second semiconductor region may come into contact with the main base region in a state of being surrounded by the main base region. In addition, the resistance of the base region changes with the potential of the gate electrode. That is, the resistance of the base region is changed depending on whether or not a channel is formed. At this time, the resistance of the high-resistance region is higher than the resistance of the base region when the potential of the gate electrode is lower than a gate threshold, that is, when a channel is not formed.

Leakage current is caused by the flow of a number of carriers (that is, electrons in a case of an n-channel MOSFET, holes in a case of a p-channel MOSFET, and electrons in a case of an IGBT) of the first conduction type semiconductor. In the insulated gate switching element, the high-resistance region is disposed in at least one of the first interface which is the interface between the base region and the first semiconductor region and the second interface which is the interface between the base region and the second semiconductor region. The high-resistance region has high resistance to a number of carriers of the first conduction type semiconductor. Due to the presence of the high-resistance region, a number of carriers (that is, electrons or holes) of the first conduction type semiconductor are less likely to flow between the first semiconductor region and the second semiconductor region when the insulated gate switching element is off. Therefore, leakage current is less likely to flow in the insulated gate switching element. In addition, since the high-resistance region is separated from the gate insulating film, current in the channel that is adjacent to the gate insulating film is not impeded by the high-resistance region when the insulated gate switching element is on. As described above, by providing the high-resistance region, leakage current can be suppressed without the deterioration of the on-characteristics of the insulated gate switching element.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
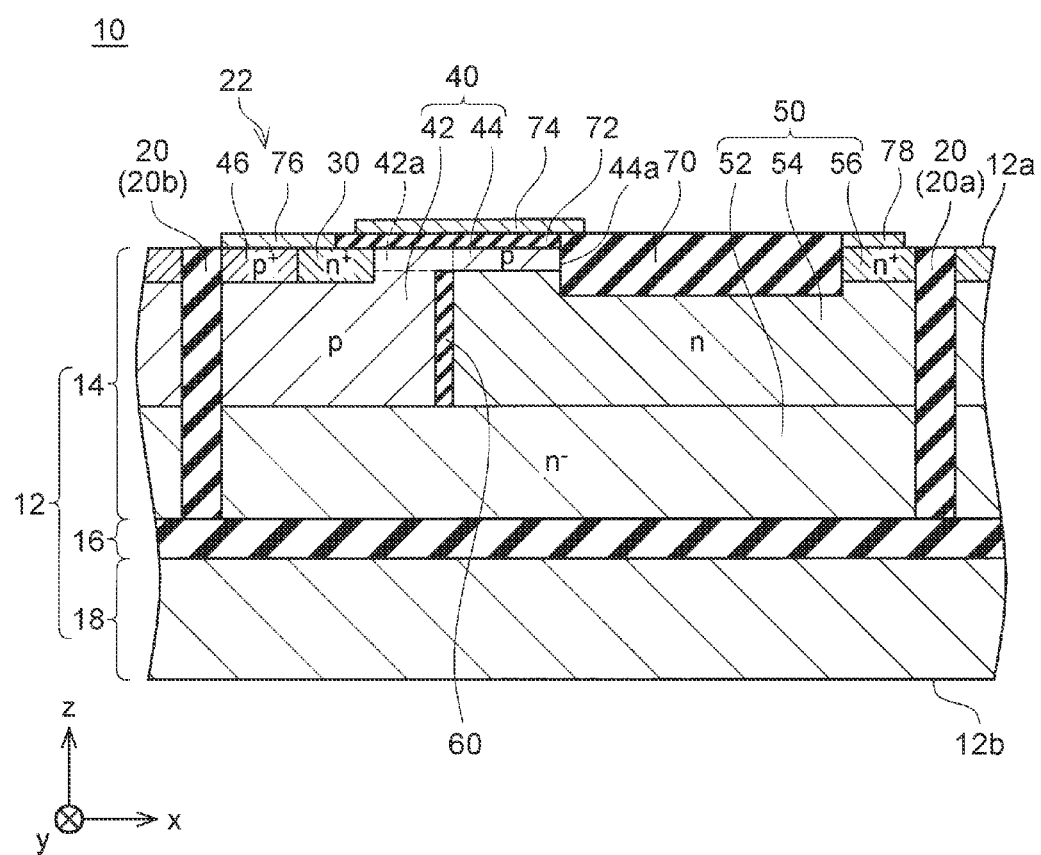
FIG. 1 is a longitudinal sectional view of a MOSFET 10 of Example 1.

A MOSFET 10 of Example 1 illustrated in FIG. 1 is an n-channel MOSFET. The MOSFET 10 includes a silicon on insulator (SOI) substrate 12. In the following description, a direction parallel to a surface 12a of the SOI substrate 12 (rightward and leftward directions in FIG. 1) is referred to as an x direction, a direction that is parallel to the surface 12a and is perpendicular to the x direction is referred to as a y direction, and a thickness direction of the SOI substrate 12 is referred to as a z direction. The SOI substrate 12 includes a handle layer 18, a box layer 16, and a device layer 14. The handle layer 18 is formed of single-crystal silicon. The handle layer 18 is exposed at a rear surface 12b of the SOI substrate 12. The box layer 16 is formed of silicon oxide. The box layer 16 is laminated on the handle layer 18. The device layer 14 is formed of single-crystal silicon. The device layer 14 is laminated on the box layer 16. The device layer 14 is insulated from the handle layer 18 by the box layer 16. In addition, in the SOI substrate 12, boundary insulating films 20 which extend to penetrate through the device layer 14 are formed. The boundary insulating films 20 extend from the surface 12a of the SOI substrate 12 to the box layer 16. The device layer 14 is divided into a plurality of cell regions 22 by the boundary insulating films 20. In each of the cell regions 22 defined by the boundary insulating films 20, a MOSFET structure is formed.

On the surface 12a of the SOI substrate 12 in the cell region 22, a local oxidation of silicon (LOCOS) film 70, a gate insulating film 72, a gate electrode 74, a source electrode 76, and a drain electrode 78 are formed.

The gate insulating film 72 is an insulating film formed of silicon oxide. The gate insulating film 72 is disposed on the surface 12a. The gate insulating film 72 does not come into contact with any of two boundary insulating films 20a and 20b which define both ends of the cell region 22 in the x direction.

The gate electrode 74 is disposed on the gate insulating film 72. The gate electrode 74 faces the device layer 14 with the gate insulating film 72 interposed therebetween. The gate electrode 74 is insulated from the device layer 14 by the gate insulating film 72.

The source electrode 76 is formed at a position adjacent to the gate insulating film 72. The source electrode 76 is formed between the gate insulating film 72 and the boundary insulating film 20b. The source electrode 76 comes into contact with the device layer 14 at a position between the gate insulating film 72 and the boundary insulating film 20b.

The LOCOS film 70 is an insulating film formed of silicon oxide. The LOCOS film 70 is adjacent to the gate insulating film 72 on the boundary insulating film 20a side. That is, the LOCOS film 70 is adjacent to the gate insulating film 72 on the side opposite to the source electrode 76. In other words, the gate insulating film 72 is disposed between the LOCOS film 70 and the source electrode 76. The thickness of the LOCOS film 70 is greater than that of the gate insulating film 72. In an area in which the LOCOS film 70 is formed, the surface 12a of the SOI substrate 12 is positioned closer to the lower side (the rear surface 12b side) than the other region. That is, a portion of the surface 12a is formed in a recessed shape, and the LOCOS film 70 is disposed to fill the recessed portion. Therefore, the lower end of the LOCOS film 70 is positioned closer to the lower side than the lower end of the gate insulating film 72.

The drain electrode 78 is adjacent to the LOCOS film 70 on the boundary insulating film 20a side. The drain electrode 78 is formed between the LOCOS film 70 and the boundary insulating film 20a. The drain electrode 78 comes into contact with the device layer 14 at a position between the LOCOS film 70 and the boundary insulating film 20a.

In the cell region 22, a source region 30, a contact region 46, a base region 40, and a drain region 50 are formed.

The source region 30 is an n-type region having a high n-type impurity concentration. The source region 30 is exposed at the surface 12a. The source region 30 comes into contact with the source electrode 76 and the gate insulating film 72. The source region 30 forms an ohmic contact to the source electrode 76.

The contact region 46 is a p-type region having a high p-type impurity concentration. The contact region 46 is formed between the source region 30 and the boundary insulating film 20b. The contact region 46 is exposed at the surface 12a of the SOI substrate 12. The contact region 46 forms an ohmic contact to the source electrode 76.

The base region 40 is a p-type region. The base region 40 comes into contact with the source region 30 and the contact region 46. The base region 40 includes a main base region 42 and a surface layer base region 44.

The p-type impurity concentration of the main base region 42 is lower than that of the contact region 46. The main base region 42 is formed on the lower side of the contact region 46 and the source region 30. The main base region 42 comes into contact with the contact region 46 and the source region 30. In addition, a portion of the main base region 42 extends to an area that is adjacent to the source region 30 and is exposed at the surface 12a in the area. In the following description, the portion of the main base region 42 which is adjacent to the source region 30 and is exposed at the surface 12a is referred to as a surface layer portion 42a. The surface layer portion 42a comes into contact with the gate insulating film 72.

Figure 2:
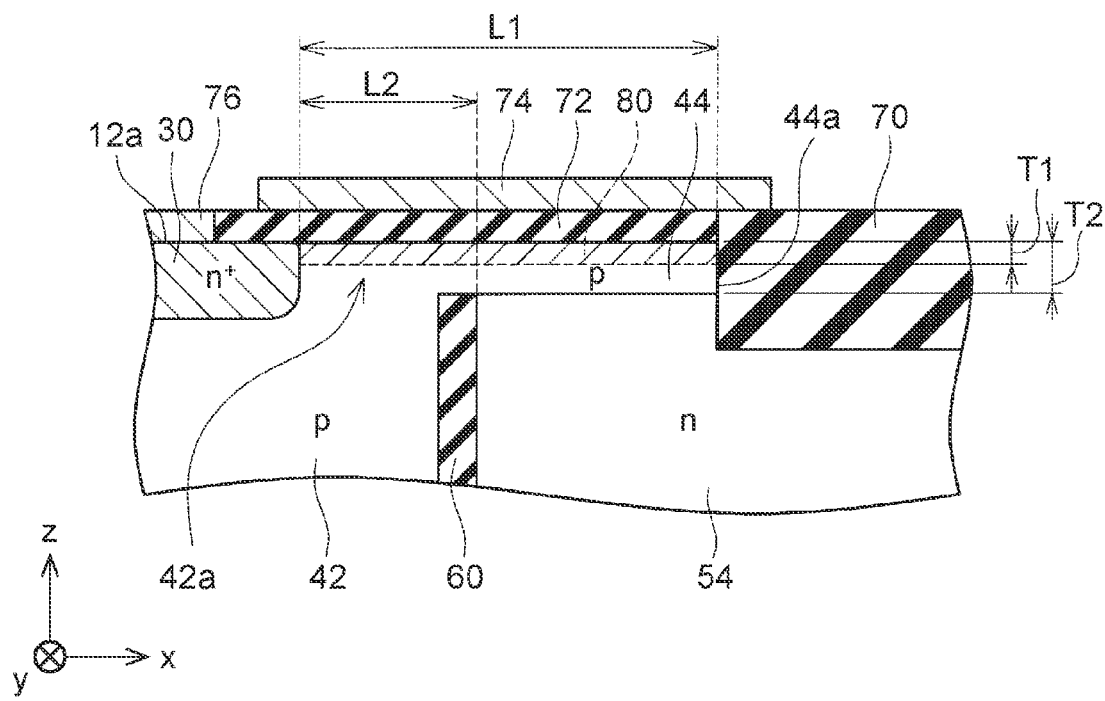
FIG. 2 is an enlarged sectional view of the vicinity of a surface layer portion 42a and a surface layer base region 44 of the MOSFET 10 of Example 1.

The p-type impurity concentration of the surface layer base region 44 is approximately equal to the p-type impurity concentration of the main base region 42 and is lower than the p-type impurity concentration of the contact region 46. The surface layer base region 44 is exposed at the surface 12a at a position that is adjacent to the main base region 42 (more specifically, the surface layer portion 42a). That is, the surface layer portion 42a of the main base region 42 is disposed between the surface layer base region 44 and the source region 30. The surface layer base region 44 is formed only in the vicinity of the surface 12a. A thickness T2 (that is, a dimension in the z direction) of the surface layer base region 44 illustrated in FIG. 2 is smaller than the thickness of the main base region 42 (that is, the distance from the surface 12a to the lower end of the main base region 42). The thickness T2 is 20 nm or smaller. The surface layer base region 44 extends from the surface layer portion 42a toward the LOCOS film 70 side along the surface 12a. An end surface 44a of the surface layer base region 44 on the LOCOS film 70 side comes into contact with the LOCOS film 70. The lower end of the surface layer base region 44 is positioned closer to the surface 12a side than the lower end of the LOCOS film 70. Therefore, the entire region of the end surface 44a of the surface layer base region 44 comes into contact with the LOCOS film 70. In addition, the surface layer base region 44 comes into contact with the gate insulating film 72. More specifically, the gate insulating film 72 covers the entire region of the surfaces of the surface layer base region 44 and the surface layer portion 42a in the x direction. The gate insulating film 72 also covers a portion of the surface of the source region 30. In addition, the gate electrode 74 is disposed above the entire region of the surface layer base region 44 and the surface layer portion 42a in the x direction. The gate electrode 74 extends from the upper portion of the source region 30 to the upper portion of the LOCOS film 70. That is, the gate electrode 74 is disposed across the upper portions of the source region 30, the surface layer portion 42a, the surface layer base region 44, and the LOCOS film 70. Broken line on the lower side of the surface layer portion 42a in FIG. 1 represents the outline of the surface layer portion 42a. Broken line between the surface layer portion 42a and the surface layer base region 44 represents the boundary therebetween. Any of the broken lines does not represent the physical boundary, and the entirety of the base region 40 is formed as a p-type region.

The drain region 50 is an n-type region. The drain region 50 comes into contact with the base region 40. The drain region 50 is separated from the source region 30 by the base region 40. The drain region 50 includes a bottom region 52, a drift region 54, and a contact region 56.

The n-type impurity concentration of the contact region 56 is high. The contact region 56 is formed between the LOCOS film 70 and the boundary insulating film 20a. The contact region 56 is exposed at the surface 12a of the SOI substrate 12. The contact region 56 forms an ohmic contact to the drain electrode 78.

The n-type impurity concentration of the drift region 54 is lower than that of the contact region 56. The drift region 54 is formed on the lower side of the surface layer base region 44, the LOCOS film 70, and the contact region 56. The drift region 54 comes into contact with the surface layer base region 44, the LOCOS film 70, and the contact region 56. The drift region 54 comes into contact with the surface layer base region 44 on the rear surface 12b side (that is, comes into contact with the lower surface of the surface layer base region 44). In addition, the drift region 54 is adjacent to the main base region 42 with an interface insulating film 60 interposed therebetween, which will be described later.

The n-type impurity concentration of the bottom region 52 is lower than that of the drift region 54. The bottom region 52 is formed on the lower side of the drift region 54 and the main base region 42. The bottom region 52 comes into contact with the drift region 54 and the main base region 42. In addition, the bottom region 52 comes into contact with the box layer 16.

The interface insulating film 60 is an insulating film having an extremely high resistance. The interface insulating film 60 is formed along the interface between the main base region 42 and the drift region 54. The interface insulating film 60 does not extend to the surface 12a. Therefore, the interface insulating film 60 is separated from the gate insulating film 72. The interface insulating film 60 is positioned between the source electrode 76 and the drain electrode 78 in the x direction. Therefore, in a plan view of the surface 12a of the SOI substrate 12, the interface insulating film 60 is positioned in an area between the source electrode 76 and the drain electrode 78.

Next, the operation of the MOSFET 10 will be described. During the use of the MOSFET 10, a voltage is applied between the drain electrode 78 and the source electrode 76 with the drain electrode 78 at higher potential. At this time, when the potential of the gate electrode 74 (gate voltage) is increased, as illustrated in FIG. 2, electrons accumulate in a region in the surface layer portion 42a and the surface layer base region 44 near the gate insulating film 72, such that a channel 80 (inversion layer) is formed. The channel 80 is formed across the surface layer portion 42a and the surface layer base region 44. That is, the channel 80 is formed to extend from the source region 30 to the LOCOS film 70. While the potential of the gate electrode 74 is relatively low, the thickness T1 of the channel 80 is smaller than the thickness T2 of the surface layer base region 44. Therefore, the channel 80 is not connected to the drift region 54 and the MOSFET 10 is not turned on. When the gate potential is increased, the thickness of the channel 80 is increased. When the thickness T1 of the channel 80 reaches the thickness T2 of the surface layer base region 44, the source region 30 and the drift region 54 (that is, the drain region 50) are connected to each other by the channel 80. Therefore, electrons flow from the source region 30 to the drain region 50 through the channel 80. That is, the MOSFET 10 is turned on. Since the drift region 54 is formed on the lower side of the surface layer base region 44, electrons that flow into the surface layer base region 44 from the surface layer portion 42a flow downward into the drift region 54. Therefore, a portion of the channel 80 in which the electrons primarily flow is the channel 80 in the surface layer portion 42a, and the current density of the channel 80 in the surface layer base region 44 is decreased. That is, in the MOSFET 10, although an actual length L1 of the channel 80 is long, an effective channel length that affects the on-resistance of the MOSFET 10 is a length L2 of the surface layer portion 42a in the x direction. Since the channel length L2 is short, the on-resistance of the MOSFET is low.

In addition, since the thickness T2 of the surface layer base region 44 is 20 nm or smaller, in order to form the channel 80 over the entirety of the surface layer base region 44 in the thickness direction thereof, the thickness of the channel 80 needs to reach 20 nm at the maximum. According to a practical gate potential in the power semiconductor field for high current control, it is possible to increase the thickness T1 of the channel 80 to 20 nm. Therefore, when the thickness T2 of the surface layer base region 44 is designed to be 20 nm or smaller, the MOSFET 10 can be appropriately switched.

In the MOSFET 10, a parasitic bipolar transistor having an npn structure is formed by the source region 30, the main base region 42, and the drain region 50. When the MOSFET 10 is turned on, if carriers directly move between the main base region 42 and the drain region 50 without passing through the channel 80, the parasitic bipolar transistor is turned on, and the MOSFET 10 malfunctions. However, in the MOSFET 10, since the interface insulating film 60 is formed between the main base region 42 and the drift region 54, the movement of carriers is suppressed. Therefore, the parasitic bipolar transistor is less likely to be turned on in the MOSFET 10.

Figure 3:
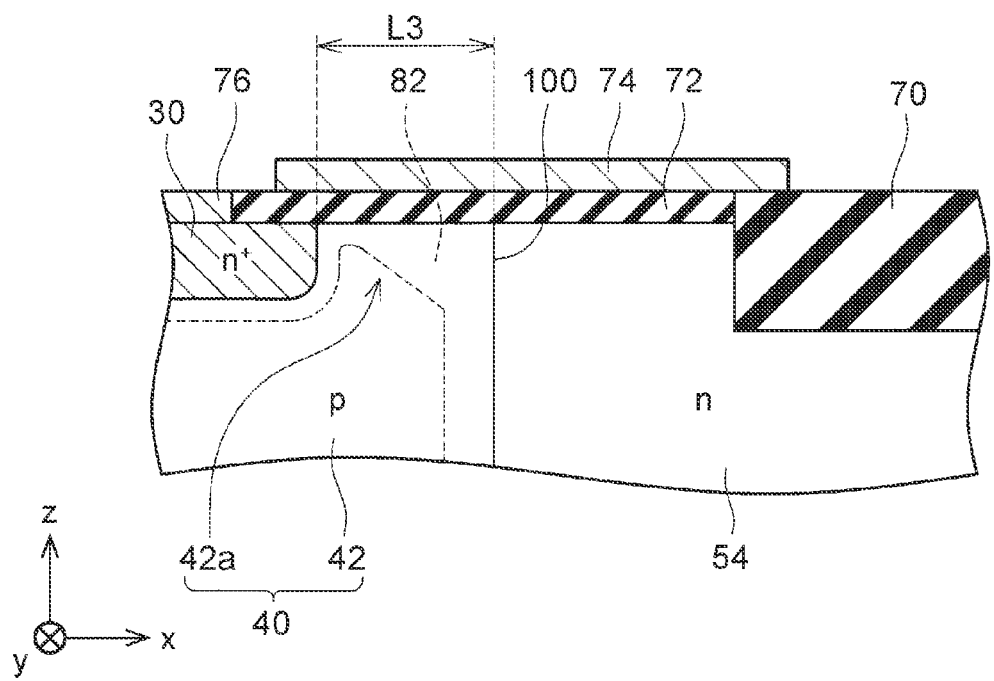
FIG. 3 is an enlarged sectional view of the vicinity of the surface layer portion 42a of a MOSFET of a comparative example.

Next, a short-channel effect will be described with reference to FIG. 3 illustrating a MOSFET of a comparative example. The MOSFET of the comparative example illustrated in FIG. 3 is different from the MOSFET 10 of Example 1 in that the surface layer base region 44 is not formed. In the MOSFET of FIG. 3, the n-type drift region 54 extends the area in which the surface layer base region 44 is formed in the MOSFET 10 of Example 1. Therefore, the drift region 54 directly comes into contact with the surface layer portion 42a of the main base region 42. In addition, the MOSFET of the comparative example does not include the interface insulating film 60. In FIG. 3, a depletion layer 82 which is distributed in the base region 40 when the MOSFET is turned off is illustrated. Since the potential of the drift region 54 (that is, the drain region 50) is high, the depletion layer 82 widely extends in the surface layer portion 42a from a p-n junction 100 between the drift region 54 and the surface layer portion 42a. In the depletion layer 82, negatively fixed charges (acceptor ions) are present. When the depletion layer 82 extends to be wider than the surface layer portion 42a as illustrated in FIG. 3, a channel is easily formed in the surface layer portion 42a due to the effect of the negatively fixed charges in the depletion layer 82. Therefore, a necessary gate voltage for turning on the MOSFET (that is, the gate threshold) is decreased. As a length L3 of the surface layer portion 42a in the x direction (hereinafter, referred to as a channel length L3) is decreased, the effect of the depletion layer 82 is increased, resulting in a decrease in the gate threshold. This is the short-channel effect. In a case where the channel length L3 is great, the gate threshold is substantially constant regardless of the channel length L3. However, when the channel length L3 is decreased due to the occurrence of the short-channel effect, the gate threshold is significantly changed with the channel length L3. Therefore, the gate threshold significantly varies due to the manufacturing error of the channel length L3, and the characteristics of the MOSFET during mass production become unstable.

Contrary to this, in the MOSFET 10 of Example 1, the p-type surface layer base region 44 is formed at a position adjacent to the surface layer portion 42a, and the n-type drift region 54 (that is, the drain region 50) comes into contact with the surface layer base region 44 from the lower side. Since the drift region 54 does not directly come into contact with the surface layer portion 42a, the depletion layer is less likely to extend to the surface layer portion 42a. Therefore, the short-channel effect is less likely to occur. Therefore, the MOSFET 10 of Example 1 has a high gate threshold. In addition, even when the length L2 of the surface layer portion 42a has manufacturing errors, the gate threshold is less likely to change.

In addition, in the MOSFET 10 of Example 1, the end surface 44a of the surface layer base region 44 on the side opposite to the surface layer portion 42a comes into contact with the LOCOS film 70. That is, the end surface 44a does not come into contact with the drain region 50. Therefore, the depletion layer is less likely to extend toward the surface layer portion 42a through the surface layer base region 44 in a horizontal direction. Accordingly, the extension of the depletion layer to the surface layer portion 42a is suppressed, and the short-channel effect is less likely to occur.

Furthermore, in the MOSFET 10 of Example 1, as described above, the MOSFET 10 is not turned on by the channel 80 formed only in the vicinity of the gate insulating film 72. In a state in which the thickness T1 of the channel 80 reaches the thickness T2 of the surface layer base region 44, the MOSFET 10 is turned on. Accordingly, a high gate threshold is realized. Since the MOSFET 10 is turned on when the thickness T1 of the channel 80 reaches the thickness T2 of the surface layer base region 44, the length L2 of the surface layer portion 42a is less likely to affect the gate threshold. Therefore, even when the length L2 of the surface layer portion 42a has manufacturing errors, the gate threshold is less likely to change.

As described above, in the MOSFET 10 of Example 1, even though the effective channel length L2 is short, a high gate threshold and a stable gate threshold are realized. That is, according to the MOSFET 10, a low on-resistance, a high gate threshold, and a stable gate threshold can be realized.

When the gate voltage is reduced to be lower than the gate threshold, the channel 80 disappears, and the MOSFET 10 is turned off. Even in a case where the MOSFET 10 is off, low leakage current flows from the drain region 50 toward the source region 30. The leakage current is a current caused by electrons flowing from the source region 30 to the drain region 50 through the base region 40. In general, when the interval between the drain region 50 and the source region 30 is short, leakage current is likely to flow. However, in the MOSFET 10 of Example 1, the interface insulating film 60 is formed along the boundary surface between the main base region 42 and the drift region 54. Therefore, in an area in which the interface insulating film 60 is formed, electrons do not flow from the base region 40 to the drain region 50. Accordingly, leakage current flowing from the drain region 50 to the source region 30 can be suppressed. Particularly, the leakage current is likely to flow in an area positioned between the drain electrode 78 and the source electrode 76 in the plan view of the surface 12a of the SOI substrate 12. Therefore, as in FIG. 1, by disposing the interface insulating film 60 in an area between the drain electrode 78 and the source electrode 76, leakage current can be effectively suppressed. Accordingly, in the MOSFET 10, leakage current is less likely to flow, even though the interval between drain region 50 and the source region 30 is short. In addition, the interface insulating film 60 is separated from the gate insulating film 72. That is, the interface insulating film 60 is separated from the gate insulating film 72 and the surface layer portion 42a is formed therebetween. Therefore, the interface insulating film 60 does not impede current flowing through the channel 80.

As described above, in the MOSFET 10 of Example 1, a low on-resistance, a high gate threshold, and a stable gate threshold are realized by the surface layer base region 44. Moreover, in the MOSFET 10 of Example 1, the parasitic bipolar transistor is prevented from being turned on by the interface insulating film 60, and thus leakage current can be suppressed.

Figure 4:
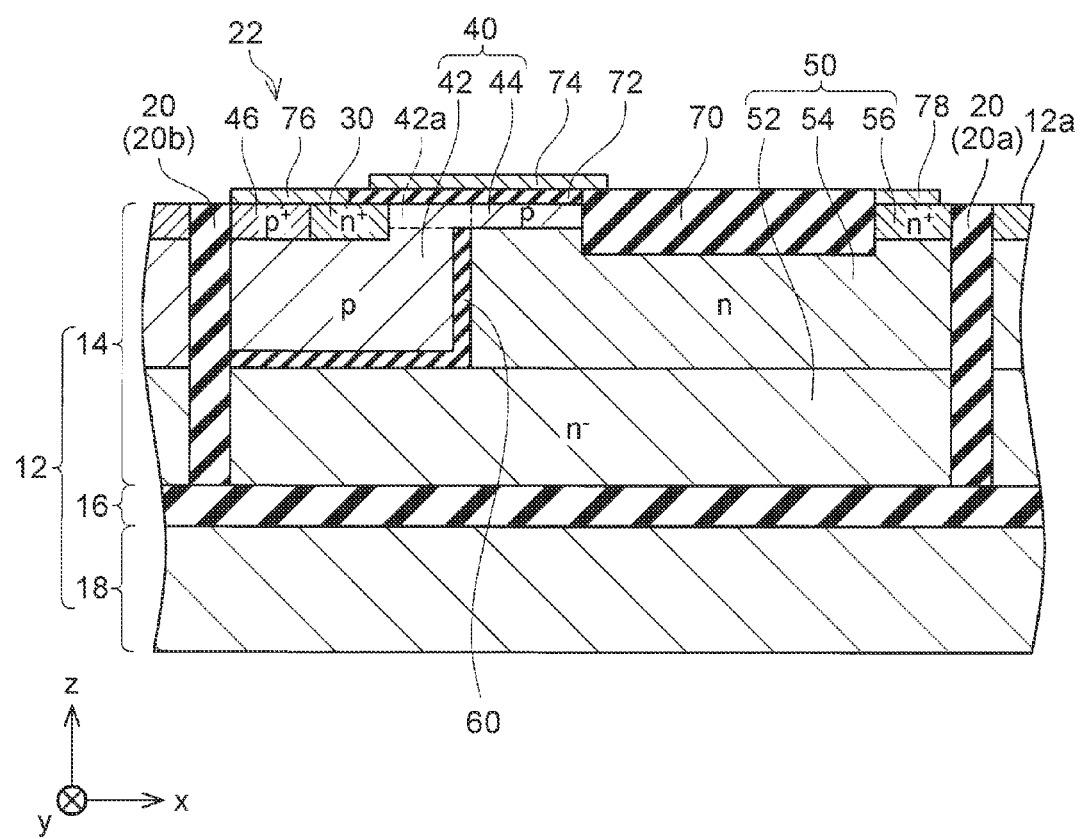
FIG. 4 is a longitudinal sectional view of a MOSFET of Example 2.

In a MOSFET of Example 2 illustrated in FIG. 4, the interface insulating film 60 is formed not only at the interface between the main base region 42 and the drift region 54 but also at the interface between the main base region 42 and the bottom region 52. That is, the interface insulating film 60 is formed in the entirety of the interface between the base region 40 and the drain region 50 excluding a position in the vicinity of the gate insulating film 72. According to the MOSFET of Example 2, leakage current can be further suppressed.

Figure 5:
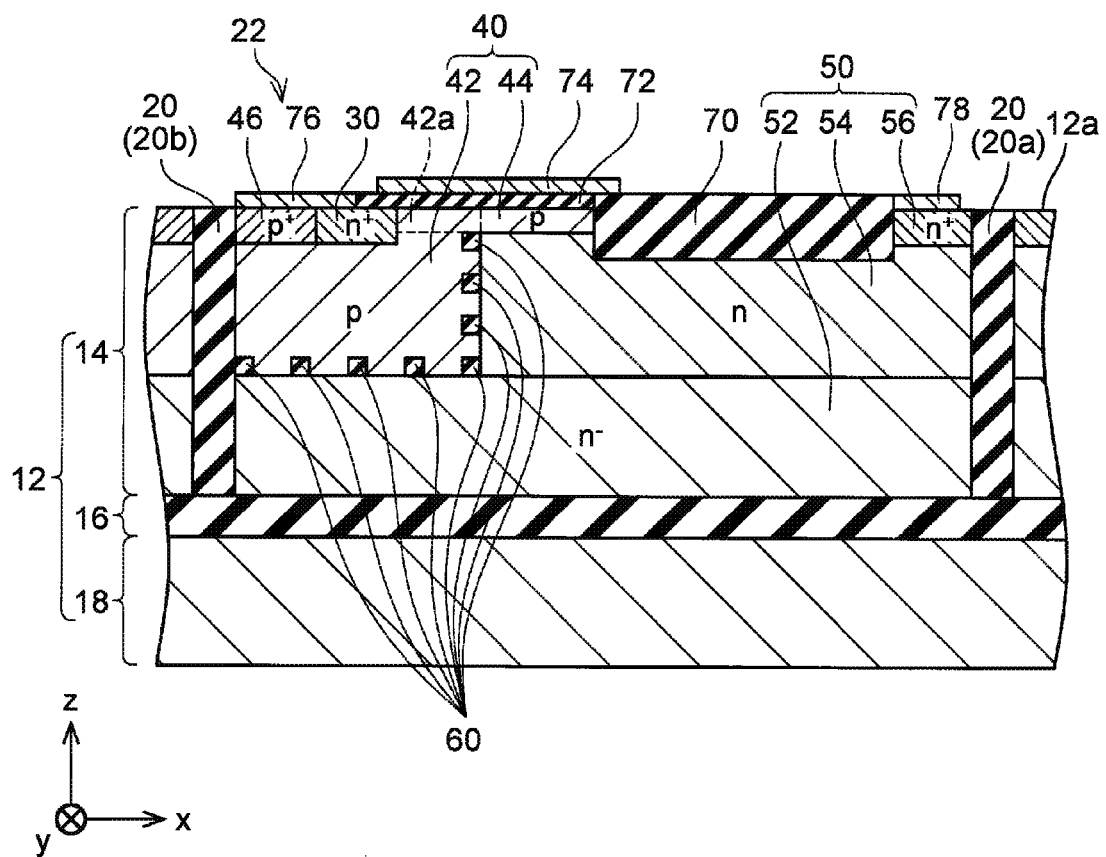
FIG. 5 is a longitudinal sectional view of a MOSFET of Example 3.

In a MOSFET of Example 3 illustrated in FIG. 5, a plurality of interface insulating films 60 are disposed at the interface between the base region 40 and the drain region 50. Intervals are formed between the interface insulating films 60. In the intervals, the base region 40 (that is, the main base region 42) comes into contact with the drain region 50 (that is, the drift region 54 and the bottom region 52). In the MOSFET of Example 3, when the MOSFET is off, a depletion layer widens from the p-n junctions formed in the intervals between the interface insulating films 60 to the drift region 54 and the bottom region 52. Therefore, a wide area of the drift region 54 and the bottom region 52 is depleted. Therefore, the MOSFET of Example 3 has high pressure resistance.

Figure 6:
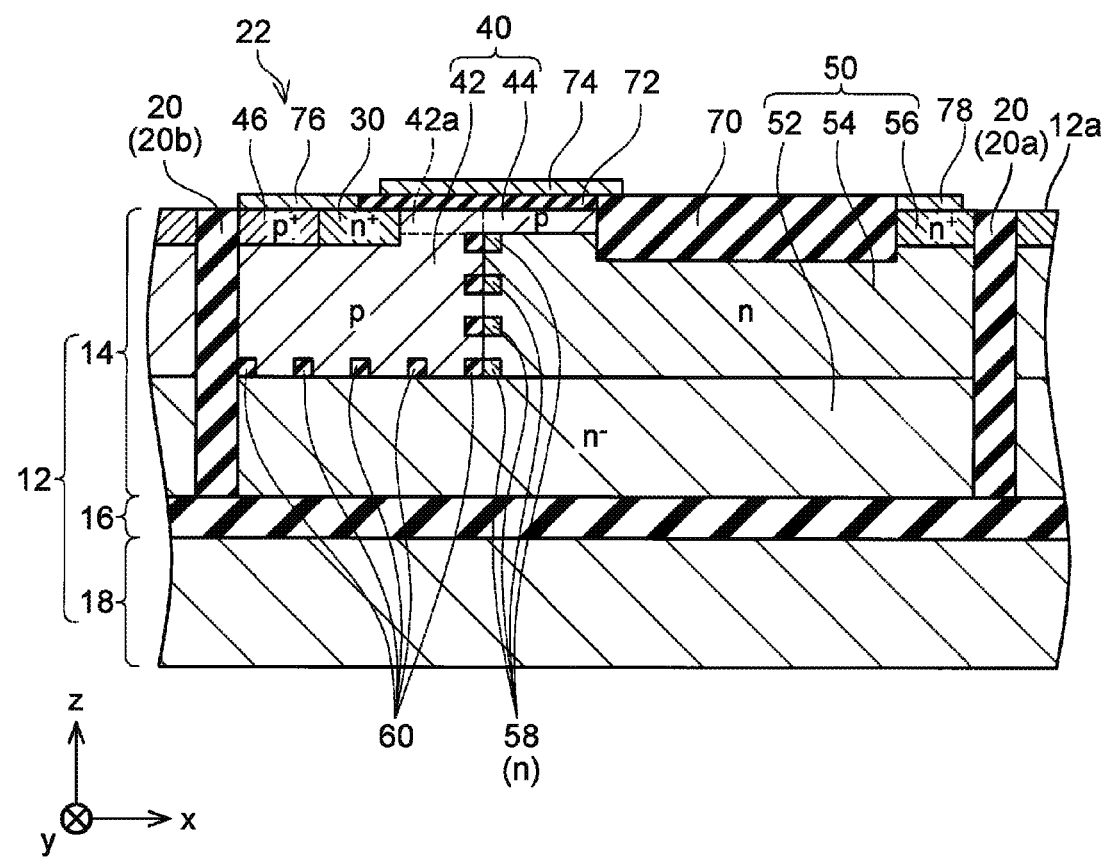
FIG. 6 is a longitudinal sectional view of a MOSFET of Example 4.

In a MOSFET of Example 4 illustrated in FIG. 6, as in the MOSFET of Example 3 (FIG. 5), a plurality of interface insulating films 60 are disposed with intervals therebetween. In addition, in the MOSFET of Example 4, the drain region 50 includes a plurality of high-concentration n-type regions 58. The high-concentration n-type region 58 has a higher n-type impurity concentration than that of the drift region 54. The high-concentration n-type region 58 comes into contact with the interface insulating film 60. The periphery of the high-concentration n-type region 58 is surrounded by the drift region 54. No interval is formed between the high-concentration n-type region 58 and the interface insulating film 60. Therefore, in the intervals between the interface insulating films 60, the drift region 54 comes into contact with the main base region 42.

The high-concentration n-type region 58 having a high n-type impurity concentration has low resistance to electrons. Therefore, when the high-concentration n-type regions 58 are arranged along the interface insulating films 60 as illustrated in FIG. 6, electrons that flow into the drain region 50 through the channel 80 easily flow to the high-concentration n-type region 58. That is, electrons easily flow downward along the interface between the base region 40 and the drain region 50. When the electrons flow downward to a deep position, electrons flow while being distributed in the drift region 54, and loss that occurs in the drift region 54 is reduced. Therefore, according to the structure of the MOSFET of Example 4, the on-resistance can be further decreased.

In addition, in the MOSFET of Example 4, the high-concentration n-type regions 58 are not disposed in the intervals between the interface insulating films 60, and the drift region 54 having a low n-type impurity concentration comes into contact with the main base region 42 in the intervals. Therefore, when the MOSFET is turned off, the widening of the depletion layer is not impeded by the high-concentration n-type region 58. The depletion layer can widely extend from the main base region 42 to the drift region 54. Therefore, the MOSFET of Example 4 has high pressure resistance.

In the MOSFETs of Examples 1 and 2, the high-concentration n-type regions 58 may also be formed at positions that come into contact with the interface insulating films 60. Even in this configuration, the on-resistance of the MOSFET can be reduced.

Figure 7:
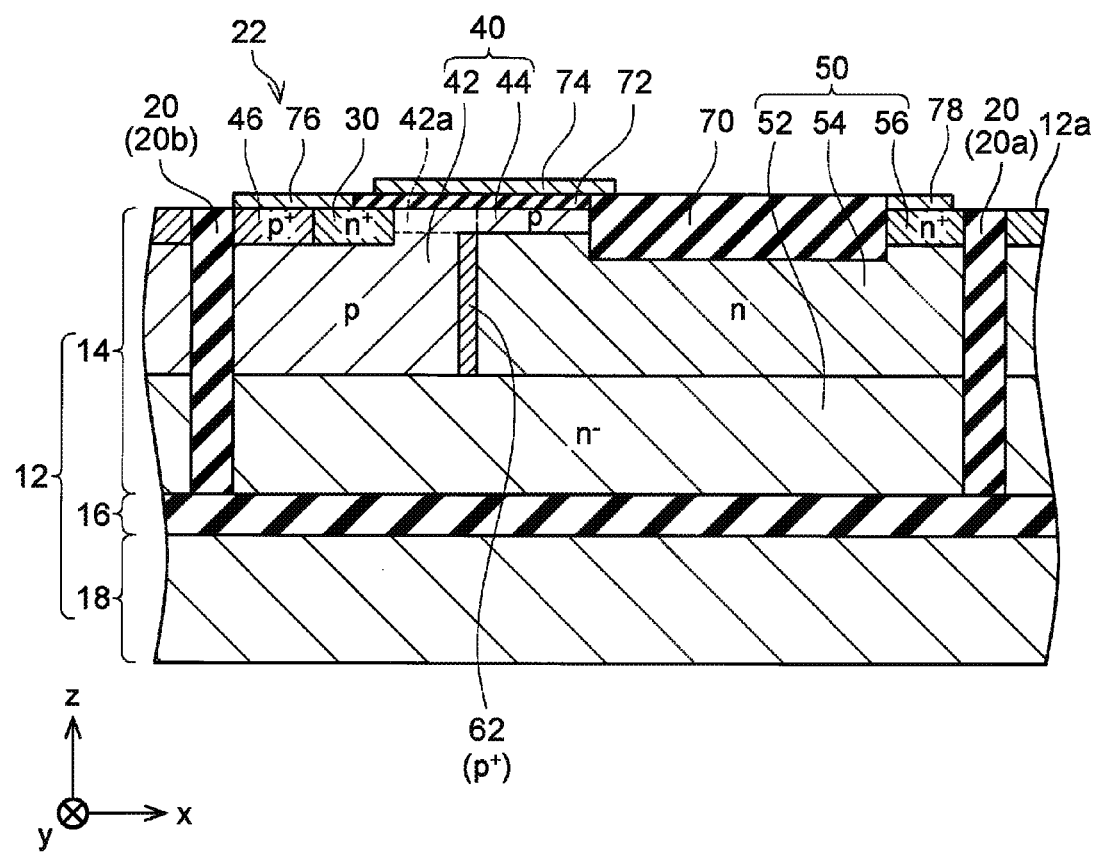
FIG. 7 is a longitudinal sectional view of a MOSFET of Example 5.

A MOSFET of Example 5 illustrated in FIG. 7 has a structure in which the interface insulating film 60 of the MOSFET 10 of Example 1 is replaced with a high-concentration p-type region 62. The high-concentration p-type region 62 is a p-type region having a higher p-type impurity concentration than that of the base region 40 (that is, the main base region 42 and the surface layer base region 44). In a case where electrons pass through the p-type region, the resistance becomes higher as the p-type impurity concentration of the p-type region becomes higher. Therefore, the resistance of the high-concentration p-type region 62 to electrons is higher than the resistance of the base region 40 to electrons. As described above, leakage current of the n-channel MOSFET occurs due to the flow of electrons. Since the high-concentration p-type region 62 has high resistance to electrons, it is difficult to allow leakage current to flow even in the MOSFET of Example 5. In addition, since the high-concentration p-type region 62 is a p-type region, a p-n junction is formed at the interface between the high-concentration p-type region 62 and the drift region 54. Therefore, when the MOSFET is turned off, the depletion layer extends from the high-concentration p-type region 62 to the drift region 54. Therefore, the MOSFET of Example 5 has high pressure resistance.

In addition, the interface insulating film 60 of the MOSFETs of Examples 2 to 4 (that is, FIGS. 4 to 6) may be replaced with the above-described high-concentration p-type region 62. Even in this configuration, leakage current can be suppressed.

In a case where the high-concentration p-type region 62 is provided, the above-described high-concentration n-type region 58 (see FIG. 6) may also be formed at a position that comes into contact with the high-concentration p-type region 62. By providing the high-concentration n-type region 58, the on-resistance can be further reduced.

Figure 8:
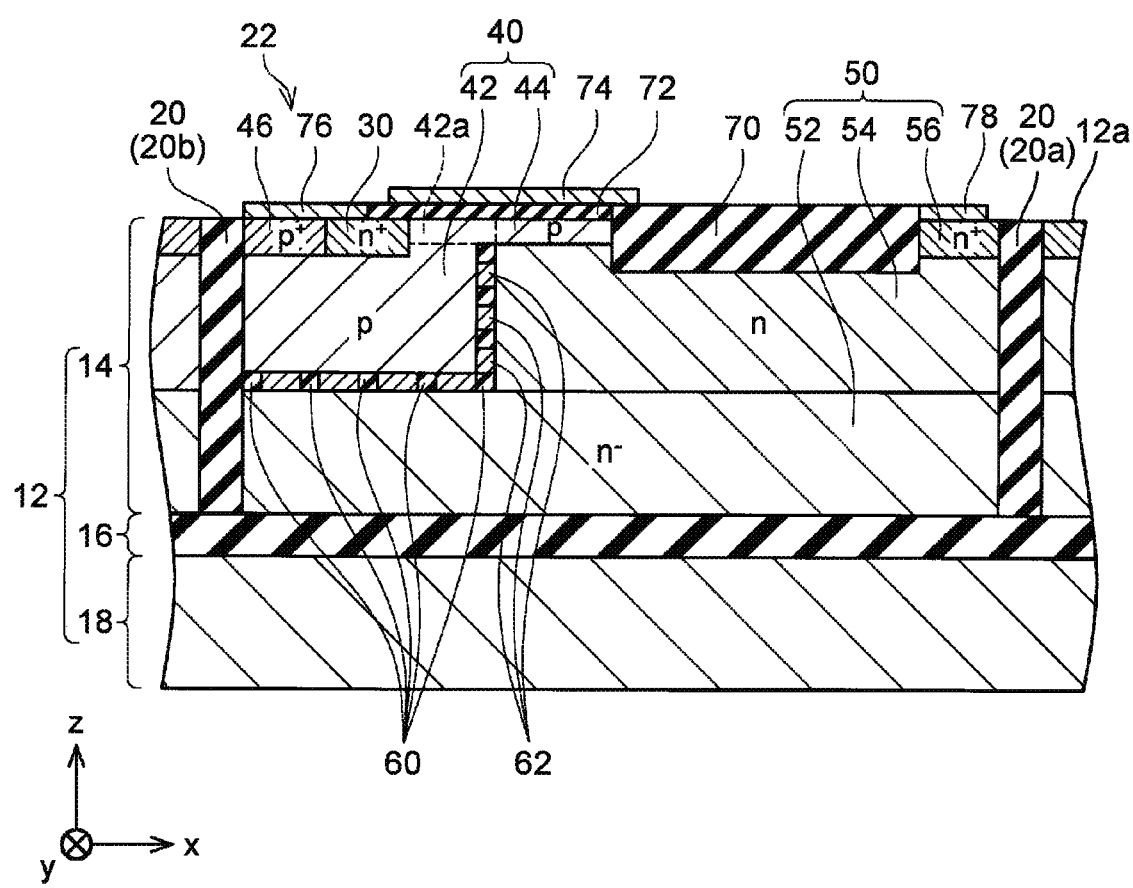
FIG. 8 is a longitudinal sectional view of a MOSFET of Example 6.

A MOSFET of Example 6 illustrated in FIG. 8 has a structure in which the high-concentration p-type regions 62 are provided in the intervals between the interface insulating films 60 of the MOSFET of Example 5. In this structure, electrons do not flow to the interface insulating films 60 and the high-concentration p-type regions 62 has high resistance to electrons. Therefore, leakage current can be suppressed. In addition, when the MOSFET is turned off, the depletion layer widens from the high-concentration p-type regions 62 to the drift region 54. Therefore, the MOSFET has high pressure resistance.

Figure 9:
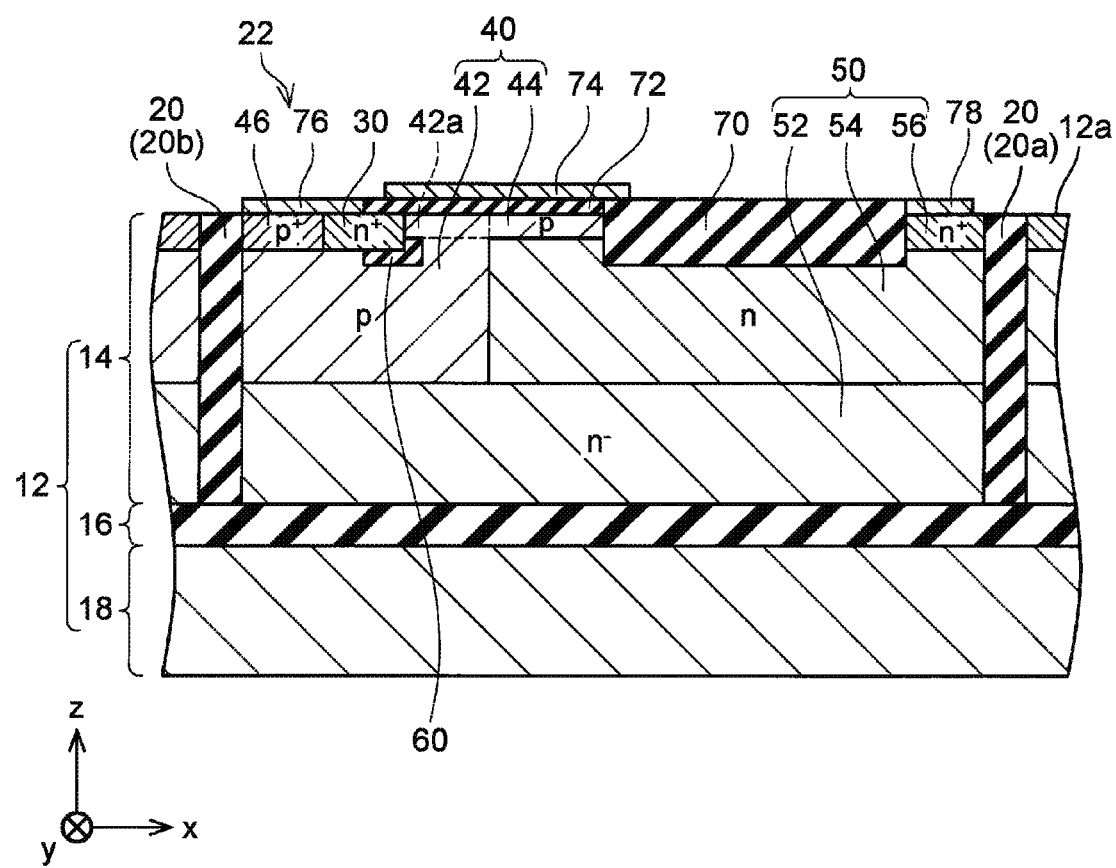
FIG. 9 is a longitudinal sectional view of a MOSFET of Example 7.

In a MOSFET of Example 7 illustrated in FIG. 9, the interface insulating film 60 and the high-concentration p-type region 62 are not formed at the interface between the base region 40 and the drain region 50. Therefore, the base region 40 and the drain region 50 come into contact with each other at the entire interface therebetween. Instead, in the MOSFET of Example 7, the interface insulating film 60 is formed at the interface between the source region 30 and the base region 40. As described above, even when the interface insulating film 60 is formed at the interface between the source region 30 and the base region 40, leakage current can be suppressed. Instead of the interface insulating film 60 of Example 7, the structure of the interface between the base region 40 and the drain region 50 of Examples 1 to 6 may also be formed at the interface between the source region 30 and the base region 40. For example, instead of the interface insulating film 60 of Example 7, the high-concentration p-type region 62 may also be formed at the interface between the source region 30 and the base region 40.

Figure 10:
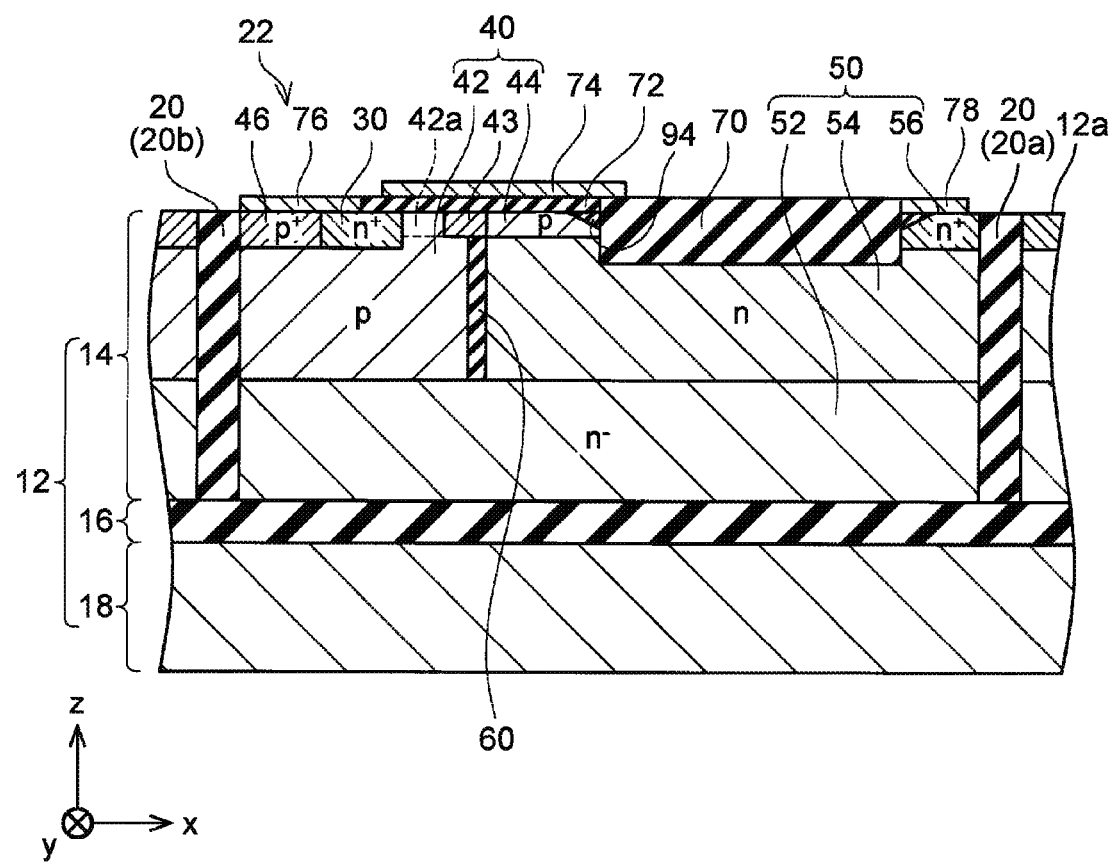
FIG. 10 is a longitudinal sectional view of a MOSFET of Example 8.

In a MOSFET of Example 8 illustrated in FIG. 10, a high-concentration surface layer region 43 is formed in a portion of the surface layer portion 42a. The p-type impurity concentration of the high-concentration surface layer region 43 is higher than that of the surface layer portion 42a positioned on the outside thereof. The p-type impurity concentration of the high-concentration surface layer region 43 is higher than that of the surface layer base region 44. In addition, the p-type impurity concentration of the high-concentration surface layer region 43 is higher than the p-type impurity concentration of the p-type region in the periphery thereof and is low enough to form the channel 80.

Figure 11:
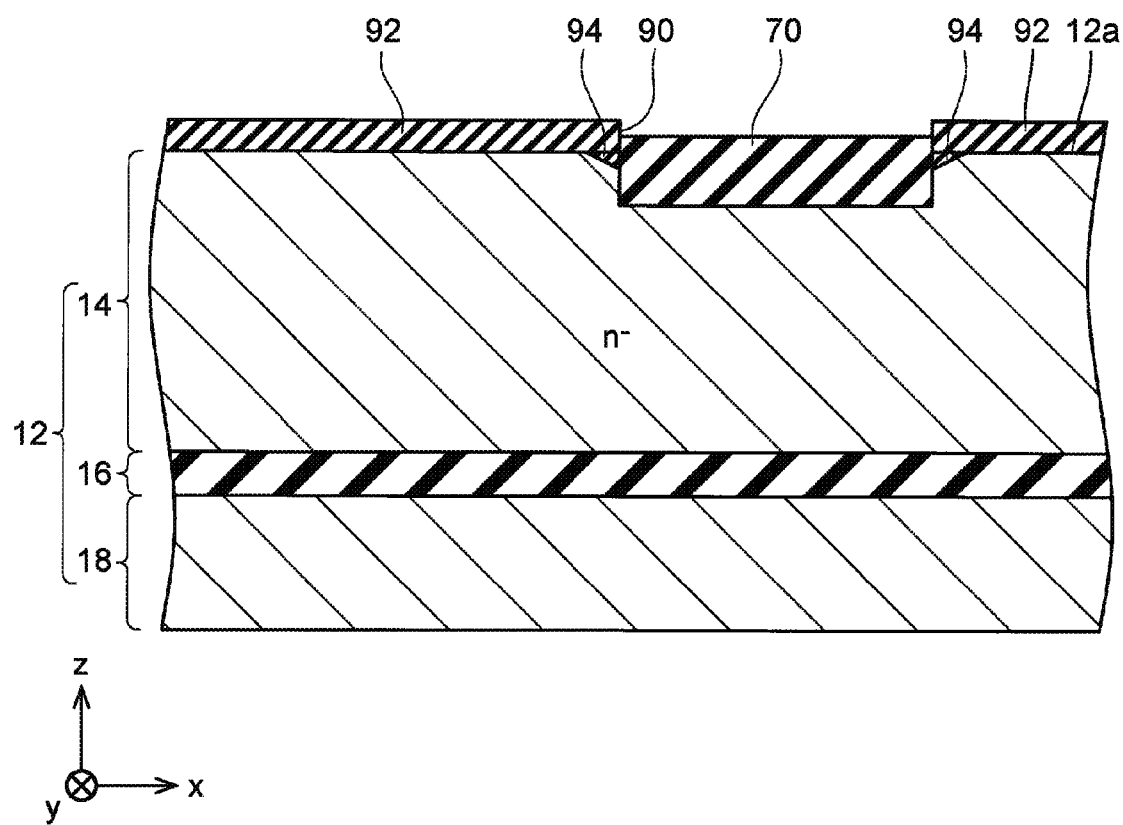
FIG. 11 is a longitudinal sectional view illustrating a manufacturing process of a MOSFET.

According to the structure of the MOSFET of Example 8, variations in the gate threshold during mass production can be suppressed. Factors that cause variations in the gate threshold are described by exemplifying the MOSFET 10 of Example 1. In a manufacturing process of the MOSFET 10, as illustrated in FIG. 11, a mask 92 having an opening 90 is formed on the surface 12a of the SOI substrate 12. The mask 92 is formed of SiN. Next, the LOCOS film 70 is formed by oxidizing the surface 12a of the SOI substrate 12 in the opening 90. Silicon that forms the device layer 14 is oxidized to a deep position, and thus the LOCOS film 70 having a large thickness is formed. At this time, there may be a case where a thin oxide film 94 may be formed in the vicinity of the opening 90 as the device layer 14 on the rear side of the mask 92 is oxidized. Thereafter, the mask 92 is removed and necessary diffusion layers, insulating films, and electrodes are formed, thereby forming the MOSFET 10. In the case where the thin oxide film 94 is formed, the thickness of an insulating film on the surface layer base region 44 (that is, the thickness of an insulating film including the oxide film 94 and the gate insulating film 72) is increased in the vicinity of the LOCOS film 70. As the thickness of the oxide film 94 is increased, the channel 80 is less likely to be formed in the surface layer base region 44 on the lower side of the oxide film 94. Since it is difficult to control the thickness of the oxide film 94, there may be a case where variations in the gate threshold of the MOSFET occur due to variations in the thickness of the oxide film 94.

Contrary to this, in the MOSFET of Example 8 illustrated in FIG. 10, the high-concentration surface layer region 43 is formed in the portion of the surface layer portion 42a. Since the high-concentration surface layer region 43 has a high p-type impurity concentration, the channel 80 is less likely to be formed in the high-concentration surface layer region 43 compared to the surface layer portion 42a and the surface layer base region 44 in the periphery thereof. Therefore, as the gate voltage is increased, the channel 80 is formed in the surface layer portion 42a and the surface layer base region 44 on the outside thereof earlier than it is formed in the high-concentration surface layer region 43. The channel 80 is formed in the high-concentration surface layer region 43 later. Therefore, the gate threshold of the MOSFET of Example 8 is determined by the p-type impurity concentration of the high-concentration surface layer region 43. Therefore, the thickness of the oxide film 94 does not affect the gate threshold. In addition, the p-type impurity concentration of the high-concentration surface layer region 43 can be accurately controlled. Therefore, when the structure of Example 8 is employed, variations in the gate threshold can be suppressed during mass production of MOSFETs.

In Example 8, the high-concentration surface layer region 43 may also be formed over the entirety region of the surface layer portion 42a. Even in this configuration, variations in the gate threshold can be suppressed.

Figure 12:
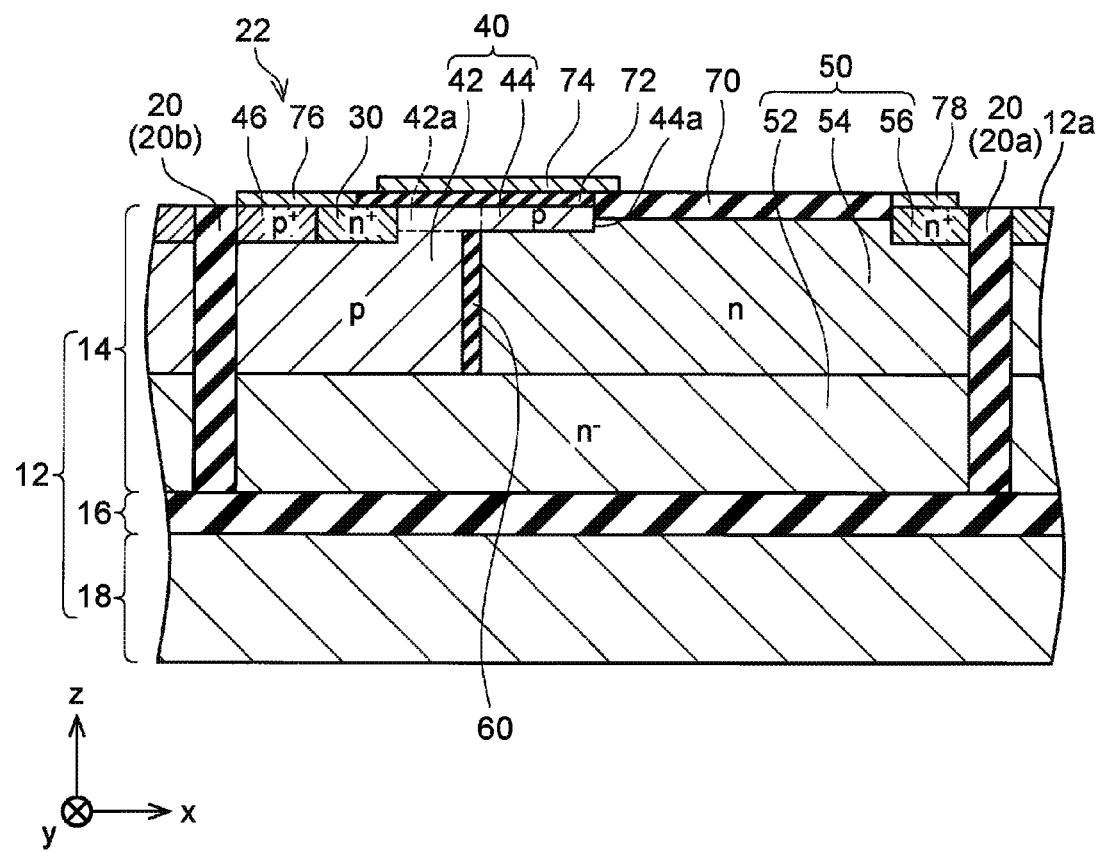
FIG. 12 is a longitudinal sectional view of a MOSFET of Example 9.

In a MOSFET of Example 9 illustrated in FIG. 12, the lower end of the LOCOS film 70 is disposed closer to the surface 12a side (shallower position) than the lower end of the surface layer base region 44. Therefore, a portion of the end surface 44a of the surface layer base region 44 on the LOCOS film 70 side comes into contact with the drift region 54 in the x direction. In this configuration, the depletion layer extends in the surface layer base region 44 in the horizontal direction from a p-n junction formed in the portion of the end surface 44a of the surface layer base region 44. Therefore, the depletion layer is more likely to extend in the surface layer portion 42a than in Example 1. Accordingly, in this structure, the short-channel effect is more likely to occur than in Example 1. However, even in this structure, since the surface layer base region 44 is present, the depletion layer is less likely to extend in the surface layer portion 42a compared to a MOSFET in the related art. That is, even in this structure, the short-channel effect can be suppressed. In addition, in the MOSFET of Example 9, the LOCOS film 70 does not need to be formed to a deep position. Therefore, the MOSFET can be efficiently manufactured. Furthermore, depending on the case, the LOCOS film 70 may not be formed, and the entire region of the end surface 44a of the surface layer base region 44 may come into contact with the drift region 54. According to this structure, the MOSFET can be more efficiently manufactured. In addition, even when the LOCOS film 70 is absent, the short-channel effect can be further suppressed by the surface layer base region 44 compared to the MOSFET in the related art.

Figure 13:
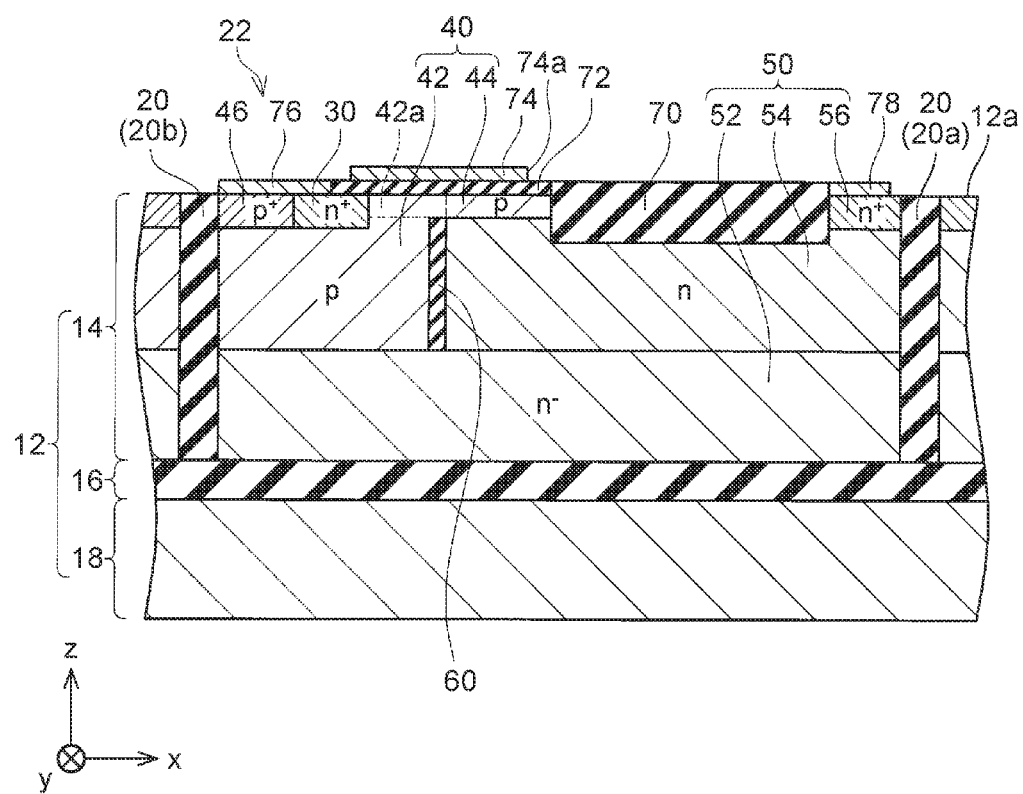
FIG. 13 is a longitudinal sectional view of a MOSFET of Example 10.

In a MOSFET of Example 10 illustrated in FIG. 13, the gate electrode 74 is shorter than that in the MOSFET 10 of Example 1. In the MOSFET of Example 10, an end portion 74a of the gate electrode 74 on the LOCOS film 70 side is positioned closer to the source region 30 side than the LOCOS film 70. That is, the gate electrode 74 is broken on the surface layer base region 44. The gate electrode 74 is disposed across the upper portions of the source region 30, the surface layer portion 42a, and the surface layer base region 44 and is not disposed on the upper portion of the LOCOS film 70. In this configuration, the channel 80 is not formed in the surface layer base region 44 (the portion thereof on which the gate electrode 74 is not present) in the vicinity of the LOCOS film 70. However, since the channel 80 is formed in the surface layer base region 44 positioned under the gate electrode 74, the MOSFET can be turned on even in this structure.

In Examples 1 to 10 described above, the n-channel MOSFETs have been described. However, the technique disclosed in this specification may also be applied to a p-channel MOSFET. In each of Examples described above, the p-channel MOSFET can be obtained through the inversion between the n-type semiconductor region and the p-type semiconductor region.

Figure 14:
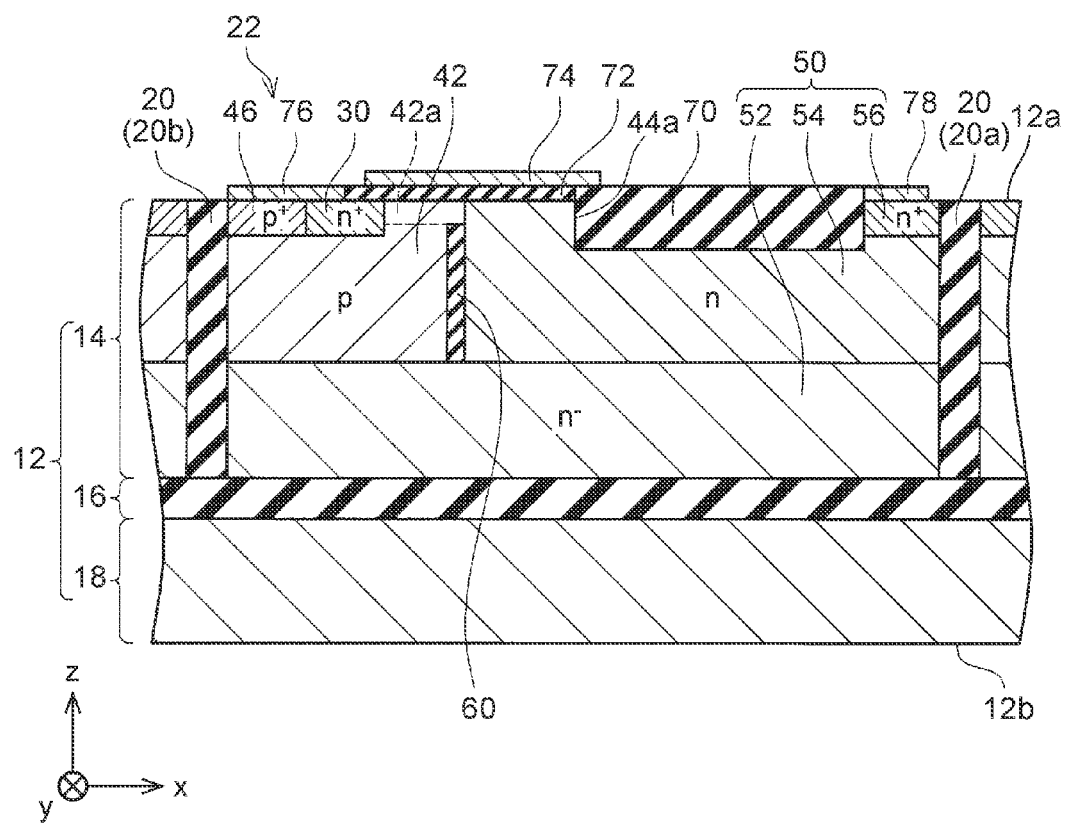
FIG. 14 is a longitudinal sectional view of a MOSFET of a modification example.

In addition, the MOSFETs of Examples 1 to 10 described above have the p-type surface layer base region 44. However, the MOSFETs of Examples 1 to 10 may not have the surface layer base region 44. For example, as illustrated in FIG. 14, instead of the surface layer base region 44, the n-type drift region 54 may be formed in the MOSFET of Example 1. That is, the n-type drift region 54 may extend to the area in which the surface layer base region 44 is formed in Example 1. Even in this configuration, the MOSFET can be operated. Even in Examples 2 to 10, as in FIG. 14, the drift region 54 may be formed instead of the surface layer base region 44.

Figure 15:
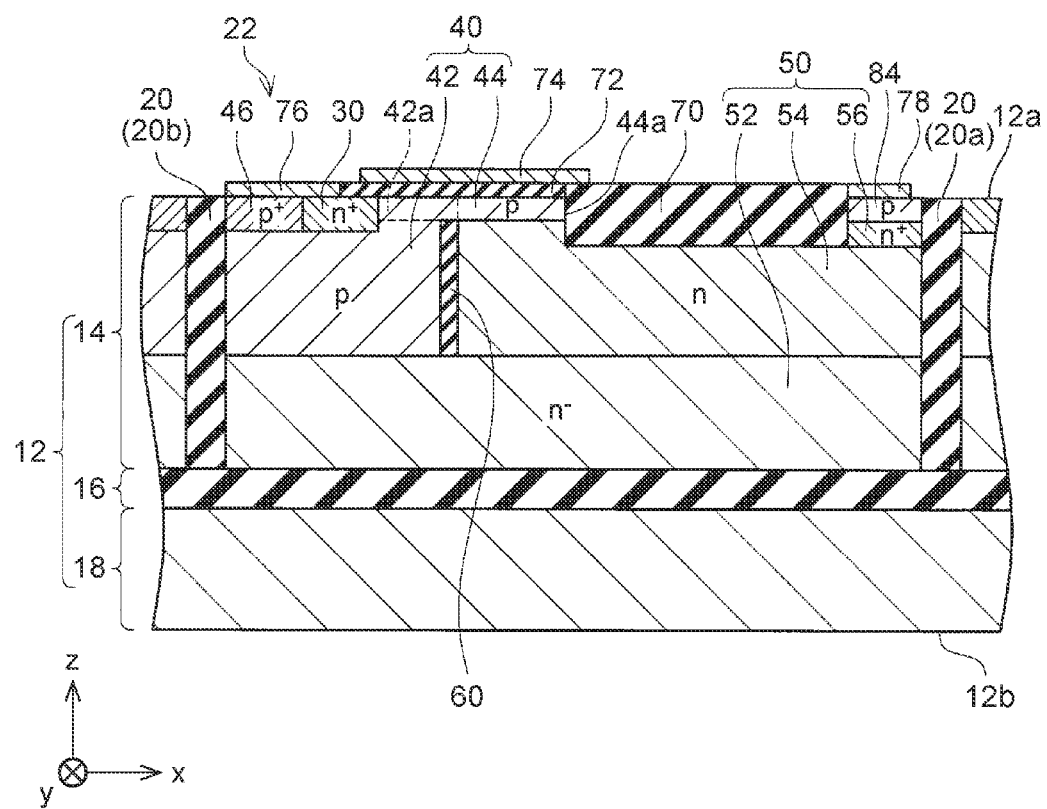
FIG. 15 is a longitudinal sectional view of an IGBT of a modification example.

The MOSFETs have been described in Examples 1 to 10 described above. However, the technique disclosed in this specification may also be applied to an IGBT. For example, as illustrated in FIG. 15, in the MOSFET of Example 1, an IGBT can be formed by disposing a p-type collector region 84 between the contact region 56 and the drain electrode 78. Even in Examples 2 to 10, an IGBT can be formed by disposing the collector region 84 as in FIG. 15.

The relationships between the constituent elements of Examples described above and constituent elements of the claims will be described. The interface insulating film 60 and the high-concentration p-type region 62 of Examples are an example of a high-resistance region of the claims. The high-concentration n-type region 58 of Examples is an example of a high-concentration region of the claims.

Technical elements disclosed in this specification are described below. The following technical elements are independently used.

An example of an insulated gate switching element disclosed in this specification has a MOSFET structure.

In the example of the insulated gate switching element disclosed in this specification, a first electrode which is disposed on the surface of the semiconductor substrate and is connected to the first semiconductor region, and a second electrode which is disposed on the surface and is connected to the second semiconductor region may be further included. At least a portion of the high-resistance region may be disposed in an area between the first electrode and the second electrode in a plan view of the surface.

According to this configuration, leakage current can be further suppressed.

In the example of the insulated gate switching element disclosed in this specification, the high-resistance region may be formed of an insulator.

In the example of the insulated gate switching element disclosed in this specification, the high-resistance region may be formed in the entirety of the second interface excluding a position in the vicinity of the gate insulating film.

According to this configuration, leakage current can be further suppressed.

In the case where the high-resistance region is formed of the insulator, a plurality of high-resistance regions may be disposed at the second interface with intervals therebetween.

According to this configuration, when the insulated gate switching element is off, a depletion layer extends in the second semiconductor region from the second interface in a portion of the interval between the high-resistance regions. Therefore, the pressure resistance of the insulated gate switching element is enhanced.

In the case where the plurality of high-resistance regions are disposed at the second interface with intervals therebetween, the second semiconductor region may have a high-concentration region which comes into contact with the high-resistance region and has a higher first conduction type impurity concentration than that of the second semiconductor region in the periphery thereof.

According to this configuration, when the insulated gate switching element is on, the carriers easily flow through the high-concentration region. That is, the carriers easily flow along the second interface in the second semiconductor region. Accordingly, the flow of the carriers in the second semiconductor region can be distributed. Therefore, the on-resistance of the insulated gate switching element can be reduced.

In the example of the insulated gate switching element disclosed in this specification, the high-resistance region may be formed as a second conduction type region having a higher second conduction type impurity concentration than that of the base region.

In the example of the insulated gate switching element disclosed in this specification, the high-resistance region may have a plurality of insulators and the second conduction type region having a higher second conduction type impurity concentration than that of the base region. The plurality of insulators may be disposed at the second interface with intervals therebetween. The second conduction type region may be disposed in the intervals between the plurality of insulators.

In the example of the insulated gate switching element disclosed in this specification, the high-resistance region may be disposed at the first interface.

What is claimed is:

1. An insulated gate switching element comprising:
    a semiconductor substrate including
        a first semiconductor region exposed at a surface of the semiconductor substrate, the first semiconductor region being a first conduction type,
        a base region exposed at the surface of the semiconductor substrate, the base region contacting the first semiconductor region, and the base region being a second conduction type and
        a second semiconductor region which is exposed at the surface of the semiconductor substrate, the second semiconductor region contacting with the base region, the second semiconductor region separated from the first semiconductor region, and the second semiconductor region being the first conduction type;
    a gate insulating film disposed on the surface of the semiconductor substrate; and
    a gate electrode disposed on the gate insulating film, wherein
    the gate electrode faces the base region in an area the first semiconductor region and the second semiconductor region are separated from each other, the gate insulating film interposed between the gate electrode and the base region, and
    a high-resistance region is disposed in at least one of a first interface and a second interface, the high-resistance region separated from the gate insulating film, the high-resistance region having higher resistance to a majority carrier of a first conduction type semiconductor than that of the base region, the first interface being an interface between the base region and the first semiconductor region, and the second interface being an interface between the base region and the second semiconductor region.

2. The insulated gate switching element according to claim 1, wherein
    the insulated gate switching element has a MOSFET structure.

3. The insulated gate switching element according to claim 1, further comprising:
    a first electrode disposed on the surface of the semiconductor substrate and connected to the first semiconductor region; and
    a second electrode disposed on the surface of the semiconductor substrate and connected to the second semiconductor region, wherein
    at least a portion of the high-resistance region is disposed between the first electrode and the second electrode in a plan view of the surface of the semiconductor substrate.

4. The insulated gate switching element according to claim 1, wherein
    the high-resistance region is an insulator.

5. The insulated gate switching element according to claim 1, wherein
    the high-resistance region is disposed in an entirety of the second interface excluding a position in a vicinity of the gate insulating film.

6. The insulated gate switching element according to claim 4, wherein
a plurality of high-resistance regions are disposed at the second interface with intervals between each of the high-resistance regions.

7. The insulated gate switching element according to claim 6, wherein
the second semiconductor region includes a high-concentration region which contacts the high-resistance region and has a higher first conduction type impurity concentration than that of the second semiconductor region in a periphery of the high-concentration region.

8. The insulated gate switching element according to claim 1, wherein
the high-resistance region is the second conduction type, and has a higher second conduction type impurity concentration than that of the base region.

9. The insulated gate switching element according to claim 1, wherein
the high-resistance region includes a plurality of insulators and a second conduction type region having a higher second conduction type impurity concentration than that of the base region,
the plurality of insulators are disposed at the second interface with intervals therebetween, and
the second conduction type region is disposed in the intervals between the plurality of insulators.

10. The insulated gate switching element according to claim 1, wherein
the high-resistance region is disposed at the first interface.

* * * * *